United States Patent
Santos et al.

(10) Patent No.: US 10,774,425 B2
(45) Date of Patent: Sep. 15, 2020

(54) ELIMINATION OF H2S IN IMMERSION TIN PLATING SOLUTION

(71) Applicant: MacDermid Enthone Inc., Waterbury, CT (US)

(72) Inventors: Cherry S. Santos, Bristol, CT (US); Tyler Banker, Wallingford, CT (US); John Swanson, Woodbury, CT (US); Ernest Long, Burlington, CT (US); Fengting Xu, Bethany, CT (US)

(73) Assignee: MacDermid Enthone Inc., Waterbury, CT (US)

( * ) Notice: Subject to any disclaimer, the term of this patent is extended or adjusted under 35 U.S.C. 154(b) by 0 days.

(21) Appl. No.: 15/607,925

(22) Filed: May 30, 2017

(65) Prior Publication Data

US 2018/0347038 A1 Dec. 6, 2018

(51) Int. Cl.
*C23C 18/54* (2006.01)
*H05K 3/24* (2006.01)
*H05K 3/18* (2006.01)

(52) U.S. Cl.
CPC ............. *C23C 18/54* (2013.01); *H05K 3/244* (2013.01); *H05K 3/187* (2013.01)

(58) Field of Classification Search
CPC .......................... C23C 18/54; C23C 18/16–52
See application file for complete search history.

(56) References Cited

U.S. PATENT DOCUMENTS

| | | | |
|---|---|---|---|
| 3,507,789 A | 4/1970 | Heilweil et al. | |
| 3,658,664 A | 4/1972 | Swalheim | |
| 5,211,831 A | 5/1993 | Vitale et al. | |
| 7,148,569 B1 | 12/2006 | Wang | |
| 2008/0173550 A1 | 7/2008 | Kiso et al. | |
| 2009/0238979 A1* | 9/2009 | Decesare | C23C 18/1831 427/305 |
| 2011/0097597 A1* | 4/2011 | Yau | C23C 18/54 428/647 |
| 2012/0148733 A1* | 6/2012 | Arnd | C23C 18/54 427/123 |
| 2013/0277226 A1* | 10/2013 | Barz | C23C 18/52 205/252 |
| 2016/0040291 A1* | 2/2016 | Wainwright | C23C 18/1628 428/544 |

FOREIGN PATENT DOCUMENTS

| | | | | |
|---|---|---|---|---|
| DE | 19755185 | | 6/1999 | |
| JP | S60-106972 A | * | 6/1985 | ......... C23C 18/1682 |
| WO | 2017017524 A1 | | 2/2017 | |

OTHER PUBLICATIONS

Yamamoto et al., Machine Translation, JP S60-106972 (Year: 1985).*

* cited by examiner

*Primary Examiner* — Brian W Cohen
*Assistant Examiner* — Ho-Sung Chung
(74) *Attorney, Agent, or Firm* — Carmody Torrance Sandak & Hennessey LLP

(57) ABSTRACT

Upon use of an immersion tin plating solution, contaminants build in the solution, which cause the plating rate and the quality of the plated deposit to decrease. One primary contaminant, which builds in the plating solution upon use, is hydrogen sulfide, $H_2S$. If a gas is bubbled or blown through the solution, contaminants, especially hydrogen sulfide, can be effectively removed from the solution and, as a result, the high plating rate and plate quality can be restored or maintained. In this regard, any gas can be used, however, it is preferable to use a gas that will not detrimentally interact with the solution, other than to strip out contaminants. Nitrogen is particularly preferred for this purpose because it is efficient at stripping out contaminants, including hydrogen sulfide, but does not induce the oxidation of the tin ions from their divalent state to the tetravalent state, which is detrimental.

22 Claims, No Drawings

ELIMINATION OF H2S IN IMMERSION TIN PLATING SOLUTION

FIELD OF THE INVENTION

The present invention relates to a method for immersion (electroless) plating of tin and tin alloys generally, and particularly as a final finish in the manufacturing of printed circuit boards, IC substrates, semiconductor wafers and the like.

BACKGROUND OF THE INVENTION

Immersion-plated tin has been used as one of the alternative final finishes for printed wiring board (PWB) because it provides a uniform metallic coating for improved in-circuit-test (ICT) probe life, lubricity for press fit pins, and excellent solderability. Because of the strong affinity between copper and tin, inter-diffusion occurs spontaneously even at room temperature through bulk, grain boundary, and surface diffusion pathways, resulting in the formation of intermetallic compounds at the Sn/Cu interface as well as in the grain boundaries of tin-based coating layers.

Tin surfaces are used in the manufacture of printed circuit boards, IC substrates, semiconductor wafers and related devices as a final finish, serving as a solderable or bondable surface for subsequent assembly steps. Tin is primarily deposited onto copper features of a substrate, particularly contact points. The method of choice for this application is deposition of tin by electroless plating procedures with immersion plating as the most commonly applied method. The immersion plating process of tin or tin alloys onto a copper surface operates according to the following reaction:

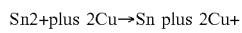

$$Sn^{2+} + 2Cu \rightarrow Sn + 2Cu^+$$

Thus divalent tin ions are reduced to tin metal by copper metal and the copper is oxidized into ionic form. In most cases the monovalent copper ions are further oxidized by oxygen in the solution to divalent copper ions. Immersion tin plating is variously referred to as "electroless tin plating", "displacement tin plating", or "conversion tin plating". As can be seen from the reaction, copper metal is dissolved from the surface of the substrate being plated and tin metal is correspondingly plated on the surface.

The tin layer deposited onto the copper features serves as a solderable and bondable surface for reflow and soldering processes as well as wire bonding. Tin layers for said applications typically have a thickness of ≤1 μm. However, a tin layer having a thickness of ≥1 μm or even ≥5 μm may be desirable.

SUMMARY OF THE INVENTION

It is an object of this invention to disclose an immersion tin plating process which is capable of maintaining high, efficient rates of plating over long periods of use.

The present invention is directed to a method for depositing a tin-based coating layer on a surface of a copper substrate. The method comprises contacting the surface of the copper substrate with an immersion tin plating composition. The composition comprises a source of Sn2+ ions preferably sufficient to provide a concentration of Sn2+ ions between about 5 g/L and about 20 g/L; a source of sulfur-based complexing agent, preferably thiourea, sufficient to provide a concentration of sulfur-based complexing agent between about 60 g/L and about 120 g/L; preferably, a source of anti-oxidant sufficient to provide a concentration of anti-oxidant between about 30 g/L and about 110 g/L; and an acid in a concentration sufficient to lower the pH of the composition between about 0 and about 5.

The present invention is further directed to an article comprising a copper substrate having a surface; and a tin-based coating layer on the surface of the substrate, wherein the tin-based coating layer has a thickness between 0.5 micrometers and 1.5 micrometers.

The inventors herein have found that, upon use of an immersion tin plating solution, contaminants build in the solution, which cause the plating rate and the quality of the deposit to decrease. One primary contaminant, which builds in the plating solution upon use, is hydrogen sulfide, H₂S. The inventors have discovered that if a gas is bubbled or blown through the solution, contaminants, especially hydrogen sulfide, can be effectively removed from the solution and, as a result, the high plating rate and plate quality can be restored or maintained. In this regard, any gas can be used, however, it is preferable to use a gas that will not detrimentally interact with the solution, but will strip out contaminants. Nitrogen is particularly preferred for this purpose because it is efficient at stripping out contaminants, including hydrogen sulfide, but does not induce the oxidation of the tin ions from their divalent state to the tetravalent state, which is detrimental.

Other objects and features will be in part apparent and in part pointed out hereinafter.

DETAILED DESCRIPTION OF THE INVENTION

The present invention is directed to a method for depositing a tin-based coating layer on a metal substrate by immersion plating. In some embodiments, the present invention is directed to a method and composition for depositing a tin alloy, such as a tin-silver alloy, coating layer on a metal substrate by immersion plating. In some embodiments, the present invention is directed to a method for depositing a tin or tin alloy as a final finish on a copper substrate in a printed wiring board, the final finish comprising a tin or tin alloy deposited from a composition by immersion plating.

The method of the present invention is capable of depositing an immersion tin-based coating layer on a metal substrate, e.g., a copper substrate, in a reasonably short time. In one embodiment, the method deposits a tin-based coating layer having a thickness of at least about 1 micrometer in about 9 minutes. In some embodiments, the method deposits a tin-based coating layer having a thickness of at least about 1.2 micrometer in about 13 minutes. In other embodiments, the method deposits 1 micrometer of tin-based coating in about 12 minutes and 1.2 micrometers of tin-based coating in about 16 minutes. The plating rate achieved depends upon the formulation of the immersion tin plating solution used, however the method of the invention is designed to maintain the initial plating rate of the bath to a greater extent than it would be maintained without the method of the invention. Plating rates, therefore, using the method of the present invention may exceed about 0.1 micrometers/minute, about 0.13 micrometers/minute, or even about 0.15 micrometers/minute. The foregoing plating rates are net plating rates determined by taking the thickness plated and dividing that by the time required to plate that thickness. Minimizing the duration of substrate exposure to the immersion tin plating solution is advantageous since the plating solution may potentially harm the solder mask, especially at high process temperatures. Quick plating rates are consistent with efficient economical manufacturing operations. In embodiments wherein the tin-based coating layer will be deposited on a metal having different physical and chemical properties than tin, e.g., copper, long term stability, and solderability of the immersion-plated tin-based coating layer are considerations, in addition to plating speed. This invention is consistent with the accomplishment of all of the foregoing consideration objectives.

The composition for depositing a tin-based coating layer by immersion plating of the present invention generally comprises a source of $Sn^{2+}$ ions, a pH adjusting agent, a complexing agent, a rate enhancer, an anti-oxidant, and a wetting agent. It may also comprise an alloying metal such as silver ions.

The source of $Sn^{2+}$ ions may be any salt comprising an anion that does not form substantially insoluble salts with other metal ions that may be in the solution. In this regard, sources of $Sn^{2+}$ ions include tin sulfate, tin methanesulfonate and other tin alkanesulfonates, tin acetate, and other tin salts that are compatible with silver ions. Preferred sources are tin sulfate and tin methanesulfonate. Since the displacement reaction between $Sn^{2+}$ ion and Cu metal is controlled by the potential of $Sn^{2+}$ (Thiourea) complex and $Cu^+$ (Thiourea) complex, it is desirable to maintain the concentrations of $Sn^{2+}$ ion, $Cu^+$ ion, and thiourea within certain preferred ranges. It is noted that copper ions enter the plating solution through use as a result of the displacement reaction.

In the EMF series, Cu is more noble than Sn, so the exchange reaction does not happen between Sn ions and Cu metal. Thiourea effectively reverses the potentials of Sn and Cu to facilitate the exchange reaction. The potentials of Sn and Cu in solution depend on the concentrations of thiourea, Sn ions, and Cu ions in the plating composition (the Cu ions are not present in the fresh bath but gradually build up as reaction takes place). In general, the higher the concentration of thiourea, the greater the potential difference between Sn and Cu, and therefore the faster the deposition rate. The concentration of thiourea is limited by its solubility in water, around 120 g/L at room temperature. The lower the $Sn^{2+}$ ion concentration, the more thiourea is available to complex Cu ion and creates a higher driving force for the exchange reaction to take place. However, it has been observed that when the concentration of $Sn^{2+}$ ions is less than about 6 g/L (about 10 g/L as $SnSO_4$), the adhesion of the coating decreases. Accordingly, in some embodiments, the source of $Sn^{2+}$ ions is added in a concentration sufficient to provide a concentration of $Sn^{2+}$ ions between about 5 g/L and about 20 g/L, such as between about 6 g/L and about 12 g/L, or between about 6 g/L and about 10 g/L.

The composition for the deposition of a tin-based coating layer of the present invention further comprises a sulfur-based complexing agent for tin ions and copper ions. Preferably, the sulfur-based complexing agent is one that, as described above, is capable of reversing the relative EMF potentials of copper and tin. Useful sulfur-based complexing agents include thiourea, N-allyl thiourea, and N-allyl-N'-β-hydroxyethyl-thiourea ("HEAT"), and the like. The sulfur-based complexing agent may be added in a concentration between about 60 g/L and 120 g/L, which is near the solubility limit of the preferred thiourea complexing agent. Preferably, the sulfur-based complexing agent is present in a concentration of at least about 90 g/L, particularly at the beginning of the deposition process since empirical results to date indicate that the desired coating thickness of about 1 micrometer or more may be deposited in about nine minutes at 70° C. when the sulfur-based complexing agent concentration is at least about 90 g/L. Since the immersion reaction mechanism gradually increases the copper ion concentration in the solution, it is preferable to gradually increase the concentration of the complexing agent as deposition continues. Empirical results to date indicate that the sulfur-based complexing agent should be added to the immersion plating composition at a rate of between about 3 g/L and about 9 g/L complexing agent per 1 g of copper ion/L buildup in the immersion tin composition of the present invention, preferably between about 5 g/L and about 7 g/L complexing agent per 1 g of copper ion/L buildup in the immersion tin composition of the present invention, such as about 6 g/L complexing agent per 1 g of copper ion/L buildup in the immersion tin composition of the present invention. Moreover, the effect of the sulfur-based complexing agent on increasing the relative deposition rate is also dependent in part on the concentration of tin ions. The high sulfur-based complexing agent concentration is most effective when the tin ion concentration is relatively low, such as between about 5 g/L and about 10 g/L tin ion. The tin ion concentration should not be too low, however, to adversely affect the adhesion of the tin-based alloy to the substrate.

Alloying ions, such as $Ag^+$ ions, may be added. The source of $Ag^+$ ions can be salts of sulfate, acetate, methane sultanate and other alkane sulfonates, and other silver salts that are substantially soluble in water. A preferred source is silver sulfate. Typically, the concentration of the source of $Ag^+$ ions is sufficient to provide between about 10 ppm and about 24 ppm silver ions, preferably between about 12 ppm and about 24 ppm silver ions, more preferably between about 12 ppm and about 20 ppm silver ions, or in some embodiments between about 10 ppm and about 16 ppm silver ions.

The immersion plating bath of the present invention preferably has an acidic pH. Accordingly, the bath pH is preferably between about 0 and about 5, preferably between about 0.2 and about 1. The preferred acidic pH can be achieved using sulfuric acid, methanesulfonic acid and other alkanesulfonic acids, acetic acid, and other acids that do not form insoluble salts with the metal ions, and combinations of such acids. In one preferred embodiment, the acid is sulfuric acid. In one preferred embodiment, the concentration of sulfuric acid (98% or more concentrated solution) is between about 20 mL/L to about 100 mL/L, preferably between about 30 mL/L and about 50 mL/L, The concentration of sulfuric acid is preferably kept within these ranges since it has been observed that the coating thickness decreases when the composition comprises less than about 30 mL/L $H_2SO_4$. Stable coating thicknesses are achieved when the composition comprises between about 30 mL/L and about 50 mL/L $H_2SO_4$. Higher acid concentrations are not desirable since that may damage the solder mask.

A source of hypophosphite may be added as a rate enhancer. The source of hypophosphite acts like a rate enhancer to the extent that it acts like a catalyst for deposition of the tin-based coating layer and is not consumed in the deposition process. This is in contrast to a reducing agent, which is normally consumed by an oxidation reaction as it reduces metal ions to metal. Herein, since the hypophosphite is a rate enhancer, it is not consumed, i.e., oxidized, during deposition, Sources of hypophosphite include sodium hypophosphite, potassium hypophosphite, ammonium hypophosphite, and phosphinic acid. Sources that may alter solution pH, such as ammonium hypophosphite and phosphinic acid, are less preferred than sources of hypophosphite that affect the solution pH slightly if at all. The source of hypophosphite may be added at a concentration of at least about 0.45 M, such as between about 0.45 M and about 1.4 M, which provides at least about 30 g/L hypophosphite ion, such as between about 30 g/L and about 100 g/L hypophosphite ion. Sodium hypophosphite is the most preferred rate enhancer. In order to function as a rate enhancer, the sodium hypophosphite concentration is relatively high such as at least about 40 g/L, such as between about 40 g/L and about 120 g/L. Empirical results to date indicate that sodium hypophosphite concentrations between about 70 g/L and about 100 g/L are particularly preferred for achieving rapid tin deposition and thick tin deposits of at least about 1 micrometer after about 9 minutes of deposition.

An anti-oxidant may be added in order to inhibit oxidation of Sn2+ ions to Sn4+ ions. Examples of suitable antioxidants include glycolic acid (hydroxyacetic acid), gluconic acid, hydroquinone, catechol, resorcin, phloroglucinol, cresolsulfonic acid and salts thereof, phenolsulfonic acid and salts thereof, catecholsulfonic acid and salts thereof, hydroquinone sulfonic acid and salts thereof, hydrazine and the like. Such antioxidants can be used singly or as a mixture of two or more kinds. The concentration of the anti-oxidant may be between about 30 g/L and about 110 g/L, such as between about 40 g/L and about 80 g/L, A preferred anti-oxidant is glycolic acid, commercially available as a 70 wt. % solution. To achieve adequate results, the glycolic acid solution (70 wt. %) may be added to the immersion tin composition at a concentration between 50 mL/L and 150 mL/L, with preferred concentrations from 70 mL/L to about 100 mL/L. Adding glycolic acid in a glycolic acid solution (70 wt. %) at these volume concentrations provides between about 35 g/L and about 105 g/L glycolic acid, preferably between about 49 g/L and about 70 g/L glycolic acid.

A wetting agent may be employed to enhance the thickness uniformity of the tin-based alloy across the substrate. A source of pyrrolidone is a preferred wetting agent. In this regard, polyvinylpyrrolidone is an especially preferred source of wetting agent. Preferred sources of polyvinylpyrrolidone include Luvitec® K30 and Luvitec® K60 from BASF. The polyvinylpyrrolidone may be added as a powder or as a pre-dissolved solution, typically having a solid concentration of 30 wt. %. In order to produce a uniform coating, the polyvinylpyrrolidone concentration is preferably at least about 12 g/L, such as between about 12 g/L and about 18 g/L, such as between about 12 g/L and about 15 g/L. Another source of wetting agent comprises 1-methyl-2-pyrrolidone, 5-methyl-2-pyrrolidone, or a combination thereof. Preferably, the wetting agent comprises 1-methyl-2-pyrrolidone. In some embodiments, the source of wetting agent comprises a source of 1-methyl-2-pyrrolidone, 5-methyl-2-pyrrolidone, or a combination thereof further in combination with polyvinylpyrrolidone. In some embodiments, the source of wetting agent comprises 1-methyl-2-pyrrolidone in combination with polyvinylpyrrolidone.

Other useful wetting agents include EO/PO copolymers, such as the Pluronics® additives, available from BASF including Pluronic® F127, Pluronic® P103, Pluronic® 123, Pluronic® 104, Pluronic® F87, Pluronic® F38, and the like. These may be added in concentrations of at least 0.01 g/L, such as from about 0.01 g/L to about 3 g/L. Other useful wetting agents include betaine-type wetting agents, such as the RALUFONS® additives, available from Raschig GmbH, such as Ralufon® DL and Ralufon® NAPE, which may be added in a concentration of at least about 0.01 g/L, such as from about 0.01 g/L to about 1 g/L. Also useful as sulfate wetting agents, such as the NIAPROOF® additives, available from Niacet Corporation, including NIAPROOF® 08, which may be added in a concentration of at least about 0.01 g/L such as from about 0.01 g/L to about 1 g/L.

A supplemental complexing agent may be added to the deposition composition. Supplemental complexing agents may be chosen from among amino acids having from 2 to 10 carbon atoms; polycarboxylic acids such as oxalic acid, citric acid, tartaric acid, gluconic acid, malic acid, lactic acid, adipic acid, succinic acid, malonic acid, and maleic acid; amino acetic acids such as nitrilotriacetic acid; alkylene polyamine polyacetic acids such as ethylenediamine tetraacetic acid ("EDTA"), diethylenetriamine pentaacetic acid ("DTPA"), N-(2-hydroxyethyl)ethylenediamine triacetic acid, 1,3-diamino-2-propanol-N,N,N',N'-tetraacetic acid, bis-(hydroxyphenyl)-ethylenediamine diacetic acid, diaminocyclohexane tetraacetic acid, or ethylene glycol-bis-((β-aminoethylether)-N,N'-tetracetic acid); polyamines such as or N,N,N',N'-tetrakis-(2-hydroxypropyl)ethylenediamine, ethylenediamine, 2,2',2"-triaminotriethylamine, triethylenetetramine, diethylenetriamine and tetrakis(aminoethyl) ethylenediamine; and N,N-di-(2-hydroxyethyl)glycine. The supplemental complexing agent may be added in a concentration of at least about 1 g/L, such as between about 1 g/L and about 20 g/L.

Substrates for depositing a tin-based coating layer thereon by immersion plating are typically metallic substrates, such as copper. In a preferred embodiment, the substrate includes copper on a printed wiring board, and the tin-based coating layer is a final finish for PWB. Other substrates include lead frames and connectors in electronic devices, which are also typically coated with copper. The method of the present invention is also applicable for depositing a tin-based coating layer onto a die pad in under bump metallization.

The metal substrate is cleaned and etched using conventional methods prior to treatment. The substrate is microetched to etch the surface and obtain the desired surface texture. Micro-etch compositions, as are known in the art, may contain oxidizing agents such as hydrogen peroxide or persulfate, in addition to acid. As is known, the ratio of oxidizing agent and acid determines the surface texture. Empirical results to date indicate that rougher surfaces are ideal for enhancing the thickness of the tin-based alloy. After the substrate is contacted with the microetch composition (by immersion, cascading, spraying, or any other technique that achieves adequate etching), the substrate is contacted with a pre-dip composition. A pre-dip composition for cleaning the surface and preventing contamination to the tin plating solution by drag-in may comprise sulfuric acid in a concentration between about 1% and about 7% by weight, such as between about 1% and about 5% by weight, or even between about 1% and about 3% by weight, for etching. Empirical evidence to date suggests that the temperature of the pre-dip composition should be between about 20° C. and about 50° C. to achieve an optimum balance of tin alloy layer thickness and uniformity on the substrate. At temperatures higher than about 50° C., thicker deposits have been observed, but these deposits are less uniform than tin layers deposited at temperatures within the preferred range.

After the substrate is contacted with the pre-dip composition (by immersion, cascading, spraying), the substrate is contacted with the tin deposition composition of the invention. Since immersion plating is a self-limiting technique and since prolonged exposure to the deposition composition may adversely affect the solder mask, it is preferred to deposit the tin alloy to a thickness of at least about 1 micrometer, or even at least about 1.2 micrometer, within a relatively short exposure duration of the substrate to the plating composition. In this regard, empirical results to date show that a plating time of about 9 minutes in the method according to the present invention achieved the desired tin alloy thickness. Since the desired thickness is typically 1 micrometer, the method of the present invention therefore achieves a plating rate of at least about 0.11 micrometers/minute, such as at least about 0.13 micrometers/minute, or even at least about 0.15 micrometers/minute. The foregoing plating rates are net plating rates determined by taking the thickness plated and dividing that by the time required to plate that thickness.

The inventors herein have discovered that, upon use, contaminants build up in the plating solution. These contaminants tend to cause the plating rate of the solution to decrease. The contaminants also cause the quality of the plated deposit to decrease. One contaminant of particular concern is hydrogen sulfide ($H_2S$), which arises as a breakdown product of thiourea or other sulfur compounds in the solution. The inventors have discovered that bubbling or blowing gas through the solution can remove these contaminants, especially the hydrogen sulfide, and either restore or maintain the plating rate or the plating quality.

Various types of gas can be used to accomplish this contaminant removal. However, it is preferable to use a gas that will not detrimentally react with other components of the plating solution. In particular, it is advantageous to use a gas that will not induce the oxidation of divalent tin in the solution to tetravalent tin. Thus while air can be used to remove the contaminants, oxygen in the air can induce the oxidation of divalent tin to tetravalent tin. This oxidation reaction is detrimental because tetravalent tin tends to be insoluble in the plating solution, and thus the insoluble tin is unavailable for plating and interferes with good plating results. As a result, it is preferred to use non-reactive gasses such as nitrogen, carbon dioxide, or argon. Nitrogen is particularly preferred from performance and cost perspectives. It is preferred that, if nitrogen is used, the purity of the nitrogen gas used be at least 90% by weight pure, preferably at least 95% by weight pure, and most preferably at least 99% by weight pure.

As noted, tin plating solutions can be utilized in simple immersion tanks or in automatic conveyor lines. Conveyor lines can apply the tin plating solution by spray or by flood application. If the tin plating solution is used in an immersion tank, the gas is simply bubbled through the plating solution. Preferable a gas dispersion sparger is placed on the floor of the immersion tank such that the sparger evenly disperses the gas throughout the tank. Most preferably the sparger comprises a fine porous material that creates very fine bubbles in the solution, however if the tin plating solution contains surfactants, then using bubbles which are very fine can lead to a foaming problem. Thus one must give consideration to both (i) the fact that finer bubbles means more surface contact with the solution and therefore better stripping of contaminants and better interfacial exchange, and (ii) the fact that bubbles that are too fine can cause a foaming issue. The bubbles sizes can range from $\frac{1}{16}^{th}$ of an inch or larger with a drilled sparger to 100 micron or smaller with a porous sparger. Preferably the bubbles are on the small end of the foregoing range being between about 500 microns and 100 microns, if the foregoing does not cause a foaming issue in the tin plating solution. If the plating solution is applied using a conveyor system, then the gas can be applied by (i) placing a sparger in the sump of the conveyorized application equipment, and/or (ii) flooding the application chamber with the gas. In the case of the sparger, it is preferably that the sparger is designed to evenly distribute the gas throughout the volume of solution. In the case of flooding the gas throughout the application chamber, this method works best with spray applications, since the spray ensures high surface area contact between the gas and the liquid. In conveyor systems, the use of the sump sparger is preferred because it maximizes the contact between the plating solution and the gas, particularly since upon exiting the sump, the gas will naturally enter the application chamber, thereby providing both modes of contact. If too much foam is created an anti-foam agent may optionally be added to the tin plating solution.

The inventors have found that continuous application of the gas contact with the plating solution is most beneficial. Thus, it is preferable to continuously contact the plating solution with the gas while the bath is being used to plate. However, it is possible to repeatedly batch treat the plating solution by contact with the gas intermittently throughout the life of the plating solution. Thus it is possible to plate with the solution for a day or days, and then strip the contaminants built up in the solution by contact with the gas. This type of batch operation has the advantage of using less gas, but the disadvantage of employing a non-steady state process.

As used herein, forcibly contacting the plating solution with the gas means (i) sparging bubbles through the plating solution, (ii) forcibly moving the gas through the solution and/or (iii) forcibly moving the solution through the gas.

As noted, the inventors have found that use of this plating process maintains the plating rate and plating quality of the plating solution over time as the solution is used. Typically an immersion tin plating solution, without the use of the invention claimed herein, will see significant reductions in plating rate and/or plating quality issues after 200 to 500 operating hours. By operating hours, we mean time that the tin plating solution is left at its elevated operating temperature and ready for plating. The inventors have discovered that use of the invention claimed herein can extend the useful life of a tin plating solution to more than 500 operating hours, preferably more than 1000 operating hours, and most preferably more than 2000 operating hours. Specifically, tin plating solutions which are treated with the inventive process claimed herein can maintain a plating rate that is within 20%, preferably within 10%, and most preferably within 5% of the initial plating rate of the tin plating solution after 500 operating hours, preferably after 1000 operating hours, and most preferably after 2000 operating hours. The inventors have also found that use of the inventive process claimed herein will similarly maintain the quality of the plated deposit for at least 500 operating hours, preferably 1000 operating hours and most preferably 2000 operating hours. Preferably, with the use of the claimed invention, the plating rate of the bath will be maintained within 5% of the initial plating rate (ie. the plating rate of the bath upon first use) after 600 operating hours.

In embodiments wherein the immersion-plated tin-based coating layer is deposited as a coating on a metal-based substrate, for example, a copper substrate, the tin-based coating layer deposited according to the method of the present invention remains free of tin whiskers after multiple thermal cycles in which the tin-based coating layer is exposed to extremes in temperature. The tin-based coating layer may have a thickness of between about 0.5 micrometers and about 1.5 micrometers, such as between about 0.7 micrometers and about 1.2 micrometers, or even between about 0.7 micrometers and about 1.0 micrometers. A tin-based coating layer deposited as a coating within these ranges of thickness on a metal substrate of the present invention remains free of tin whiskers after at least about 1000 thermal cycles in which the tin-based alloy is exposed to −55° C. for at least 10 minutes followed by exposure to 85° C. for at least 10 minutes. In some embodiments, the tin-based coating layer of the present invention deposited as a coating within these ranges of thickness remains free of tin whiskers after at least about 2000 thermal cycles in which the tin-based alloy is exposed to −55° C. for at least 10 minutes followed by exposure to 85° C. for at least 10 minutes. In some embodiments, the tin-based coating layer of the present invention deposited as a coating within these ranges of thickness remains free of tin whiskers after at least about 3000 thermal cycles in which the tin-based alloy is exposed to −55° C. for at least 10 minutes followed by exposure to 85° C. for at least 10 minutes.

In some embodiments, moreover, the method of the present invention deposits a tin-based coating layer on, for example, a copper substrate that remains solderable through multiple lead-free reflow cycles, such as at least about 3 lead-free reflow cycles.

The breakdown of solderability and the formation of tin whiskers are attributable to the formation of intermetallic compounds (IMC) in the Sn/Cu interface. Because of the spontaneous inter-diffusion between Sn and Cu atoms, the formation of IMCs is inevitable. IMC formation is temperature dependent with the rate of IMC formation increases with increasing temperature. Tin-based coatings of the present invention can sustain the high temperatures of a typical reflow process and resist IMC formation and whiskering. Moreover, the coating remains solderable, suggesting the presence of free tin on the surface after multiple reflows.

In some embodiments, solderability is maintained in the tin-based coating layer of the present invention by depositing a tin-based coating layer in which a surface region that is free of such Sn—Cu intermetallic compounds extends at least about 0.1 micrometers from the surface of the tin-based coating layer toward the substrate after at least three lead-free reflow cycles that approximate the temperatures of a typical PWB assembly step. In some embodiments, solderability is maintained by the deposition of a tin-based coating layer that resists the migration of copper into the tin-based coating layer during multiple lead-free reflow cycles, e.g., at least three lead-free reflow cycles. Preferably, the surface region that is free of copper extends at least about 0.1 micrometers from the surface of the tin-based coating layer toward the substrate after at least three lead-free reflow cycles that approximate the temperatures of a typical PWB assembly step. A typical lead-free reflow cycle comprises subjecting the article to a temperature of at least 217° C., such as between about 250° C. and about 260° C., followed by cooling to about room temperature, e.g., between about 20° C. and about 28° C. Typically, the Sn—Cu intermetallic compound free surface region extends at least about 0.1 micrometers after at least five such lead-free reflow cycles, after at least seven such lead-free reflow cycles, after at least nine such lead-free reflow cycles, after eleven of such lead-free reflow cycles, or even after fifteen of such lead-free reflow cycles. In some embodiments, the tin-based coating layer resists the migration of copper into the tin-based coating layer and is thus free of copper through at least five such lead-free reflow cycles, after at least seven such lead-free reflow cycles, after at least nine such lead-free reflow cycles, after eleven of such lead-free reflow cycles, or even after fifteen of such lead-free reflow cycles.

Preferably, the surface region of the tin-based coating layer of the present invention that is free of Cu and/or Sn—Cu intermetallic compounds extends a thickness of at least about 0.25 micrometers from the surface of the tin-based coating layer toward the substrate after at least three lead-free reflow cycles in which each cycle comprises subjecting the article to a temperature of at least 217° C., such as between about 250° C. and about 260° C., followed by cooling to about room temperature, e.g., between about 20° C. and about 28° C., after at least five such lead-free reflow cycles, after at least seven such lead-free reflow cycles, after at least nine such lead-free reflow cycles, after eleven of such lead-free reflow cycles, or even after fifteen of such lead-free reflow cycles.

Even more preferably, the surface region of the tin-based coating layer of the present invention that is free of Cu and/or Sn—Cu intermetallic compounds extend a thickness of at least about 0.35 micrometers from the surface of the tin-based coating layer toward the substrate after at least three lead-free reflow cycles in which each cycle comprises subjecting the article to a temperature of at least 217° C., such as about 260° C. followed by cooling to about room temperature, after at least five such lead-free reflow cycles, after at least seven such lead-free reflow cycles, after at least nine such lead-free reflow cycles, after eleven of such lead-free reflow cycles, or even after fifteen of such lead-free reflow cycles.

Finally, the method of the present invention also deposits tin-based coating layers on copper substrates that are characterized by good adhesion to the substrate as measured by a peel test, a common "qualitative" test used in the industry to evaluate the coating adhesion by scotch tape-pull, in which a rating of 0 to 5 is given depending on how much coating is peeled off by the scotch tape.

What is claimed is:

1. A process for plating tin or tin alloys onto the surface of a metal substrate through immersion plating, said process comprising:
   contacting the metal substrate with an immersion tin plating solution comprising:
   i. divalent tin ions, wherein the divalent tin ions comprises tin sulfate or tin methane sulfonate, wherein the concentration of divalent tin ions is between 5 g/L and 20 g/L;
   ii. an acid, wherein the acid is used to maintain a pH between about 0 and about 5 in the plating solution; and
   iii. a complexing agent, wherein the complexing agent comprises thiourea, wherein the concentration of thiourea is between about 60 g/L and about 120 g/L;
   wherein hydrogen sulfide builds up in the plating solution, causing plating quality to decrease and a plating rate to decrease more than ten percent from an initial plating rate, wherein an inert gas is bubbled through or forcibly contacted with the plating solution to remove hydrogen sulfide from the plating solution,
   whereby the plating rate and plating quality can be restored or maintained, and
   wherein the plating solution maintains a plating rate within ten percent of the initial plating rate of the plating solution after 1000 operating hours.

2. A process according to claim 1 wherein the metal substrate comprises copper.

3. A process according to claim 1, wherein the metal substrate is selected from the group consisting of printed circuit boards, electronic connectors, integrated chip holders, integrated chips, and electronic interconnect devices.

4. A process according to claim 1, wherein the inert gas comprises nitrogen gas at 90% by weight or higher purity.

5. A process according to claim 1, wherein the gas is sparged into the plating solution using a sparger that creates bubbles of the gas within the plating solution which bubbles are within the size range of $\frac{1}{16}^{th}$ of an inch to 100 microns.

6. A process according to claim 1, wherein the metal substrate is contacted with the plating solution while the metal substrate is moved along on a conveyor.

7. A process according to claim 6, wherein the gas is sparged into a sump containing the plating solution below the conveyor.

8. A process according to claim 1, wherein the initial plating rate of the plating solution is 0.08 μm per minute or higher.

9. A process according to claim 5, wherein the metal substrate is selected from the group consisting of printed circuit boards, electronic connectors, integrated chip holders, integrated chips, and electronic interconnect devices.

10. A process according to claim 5, wherein the gas comprises nitrogen gas at 90% by weight or higher purity.

11. A process according to claim 6, wherein the gas is sparged into the plating solution using a sparger which creates bubbles of the gas within the plating solution which bubbles are within the size range of 1/16th of an inch to 100 microns.

12. A process according to claim 10, wherein the metal substrate is contacted with the plating solution while the metal substrate is moved along on a conveyor.

13. A process according to claim 12, wherein the gas is sparged into a sump containing the plating solution below the conveyor.

14. A process according to claim 1 wherein the gas is bubbled through the plating solution by sparging bubbles of the gas through the plating solution.

15. A process according to claim 14, wherein the gas is sparged into the plating solution using a sparger that creates bubbles of the gas within the plating solution which bubbles are within the size range of 500 microns to 100 microns.

16. A process according to claim 1, wherein the plating solution further comprises a rate enhancer, wherein the rate enhancer is selected from the group consisting of sodium hypophosphite, potassium hypophosphite, ammonium hypophosphite, phosphinic acid and combinations thereof.

17. A process according to claim 16, wherein the concentration of the rate enhancer is at least about 0.45 M.

18. A process according to claim 16, wherein the rate enhancer comprises sodium hypophosphite, wherein the concentration of sodium hypophosphite is between about 70 g/L and about 100 g/L.

19. A process according to claim 1, wherein the plating solution further comprises a supplemental complexing agent in a concentration between about 1 g/L and about 20 g/L.

20. A process for depositing tin or tin alloys onto copper features on a printed wiring board substrate through immersion plating, said process comprising:
   contacting the copper features with an immersion tin plating solution comprising:
   i. divalent tin ions, wherein the divalent tin ions comprise tin sulfate or tin methane sulfonate, wherein the concentration of divalent tin ions is between 5 g/L and 20 g/L;
   ii. an acid, wherein the acid is used to maintain a pH between about 0 and about 5 in the plating solution; and
   iii. a complexing agent, wherein the complexing agent comprises thiourea, wherein the concentration of thiourea is between about 60 g/L and about 120 g/L;
   wherein the printed wiring board substrate is immersed in the immersion tin plating solution to deposit tin on the copper features at an initial plating rate of at least about 0.08 μm/minute to deposit a thickness of about 0.5 to about 1.5 μm of tin on the copper features;
   wherein hydrogen sulfide builds up in the plating solution during use, causing plating quality to decrease and a plating rate to decrease more than ten percent from an initial plating rate, wherein nitrogen gas is bubbled through the plating solution to remove hydrogen sulfide from the plating solution,
   whereby the plating rate and plating quality can be restored or maintained, and
   wherein the plating solution is capable of maintaining a plating rate within ten percent of the initial plating rate of the plating solution after at least 1000 operating hours.

21. The process according to claim 20, wherein nitrogen gas is bubbled through the plating solution using a gas dispersion sparger to evenly disperse the nitrogen gas throughout the plating solution.

22. The process according to claim 20, wherein the tin plating solution is maintained at a temperature of about 70° C.

* * * * *